United States Patent
Yamane et al.

(10) Patent No.: US 9,818,932 B2
(45) Date of Patent: Nov. 14, 2017

(54) STORAGE ELEMENT, STORAGE DEVICE, AND MAGNETIC HEAD

(71) Applicant: Sony Corporation, Tokyo (JP)

(72) Inventors: Kazutaka Yamane, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/031,092

(22) PCT Filed: Oct. 20, 2014

(86) PCT No.: PCT/JP2014/005318
§ 371 (c)(1),
(2) Date: Apr. 21, 2016

(87) PCT Pub. No.: WO2015/064049
PCT Pub. Date: May 7, 2015

(65) Prior Publication Data
US 2016/0268496 A1 Sep. 15, 2016

(30) Foreign Application Priority Data

Oct. 28, 2013 (JP) ................................. 2013-223352

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *G11C 11/1675* (2013.01);
(Continued)

(58) Field of Classification Search
CPC ......... H01L 43/02; H01L 43/08; H01L 43/10; G11C 11/14–11/16; G11C 11/161
See application file for complete search history.

(56) References Cited

U.S. PATENT DOCUMENTS 6,256,223 B1 7/2001 Sun
8,374,025 B1 2/2013 Ranjan et al.
(Continued)

FOREIGN PATENT DOCUMENTS

EP 1 970 911 A1 9/2008
JP 2003-017782 A 1/2003
(Continued)

OTHER PUBLICATIONS

L. Berger, "Emission of spin waves by a magnetic multilayer traversed by a current," Physical Review B, vol. 54, No. 13, pp. 9353-9357, Oct. 1, 1996.

(Continued)

*Primary Examiner* — Allison P Bernstein
(74) *Attorney, Agent, or Firm* — Michael Best & Friedrich LLP

(57) ABSTRACT

A storage element and storage devices containing the same, having a layered structure and being configured for storing information are disclosed. In one example, the storage element comprises a storage portion with a storage magnetization that is perpendicular to a film surface of the layered structure, wherein a direction of the storage magnetization is configured to change according to the information. The storage element also includes a fixed magnetization portion with reference magnetization serving as a reference to the storage magnetization, and an intermediate portion between the storage portion and the fixed magnetization portion that is made of a non-magnetic material. The fixed magnetization portion includes a laminated ferrimagnetic structure that comprises a first ferromagnetic layer, a second ferromag- (Continued)

netic layer, and a non-magnetic layer. The fixed magnetization portion includes a first magnetic material that is an alloy or a laminated structure including Pt, Co, and Y.

20 Claims, 11 Drawing Sheets

(51) Int. Cl.
*H01F 10/12* (2006.01)
*H01L 43/08* (2006.01)
*H01L 43/10* (2006.01)
*H01F 10/32* (2006.01)
*H01L 27/22* (2006.01)

(52) U.S. Cl.
CPC ....... *H01F 10/123* (2013.01); *H01F 10/3286* (2013.01); *H01L 43/08* (2013.01); *H01L 43/10* (2013.01); *H01F 10/329* (2013.01); *H01F 10/3272* (2013.01); *H01L 27/228* (2013.01)

(56) References Cited

U.S. PATENT DOCUMENTS

| | | | |
|---|---|---|---|
| 2007/0297220 A1* | 12/2007 | Yoshikawa | B82Y 25/00 365/158 |
| 2009/0251951 A1* | 10/2009 | Yoshikawa | B82Y 10/00 365/158 |
| 2010/0080050 A1 | 4/2010 | Ozeki et al. | |
| 2012/0043631 A1 | 2/2012 | Ohmori et al. | |

FOREIGN PATENT DOCUMENTS

| | | |
|---|---|---|
| JP | 2008-227388 A | 9/2008 |
| JP | 2010-080746 A | 4/2010 |

OTHER PUBLICATIONS

J.C. Slonczewski, "Current-driven excitation of magnetic multilayers," Journal of Magnetism and Magnetic Materials 159, pp. L1-L7, 1996.

S. Mangin et al., "Current-induced magnetization reversal in nanopillars with perpendicular anisotropy," Article of Nature Publishing Group, vol. 5, pp. 210-215, 2006.

S.S. P. Parkin, "Systematic Variation of the Strength and Oscillation Period of Indirect Magnetic Exchange Coupling through the 3i, 4d, and 5d Transition Metals," Physical Review Letters, vol. 67, No. 25, pp. 3598-3601, Dec. 16, 1991.

Mangin, S. et al., "Current-Induced Magnetization Reversal in Nanopillars with Perpendicular Anisotropy" Article of Nature Publishing Group, vol. 5, pp. 210-215, 2006.

* cited by examiner

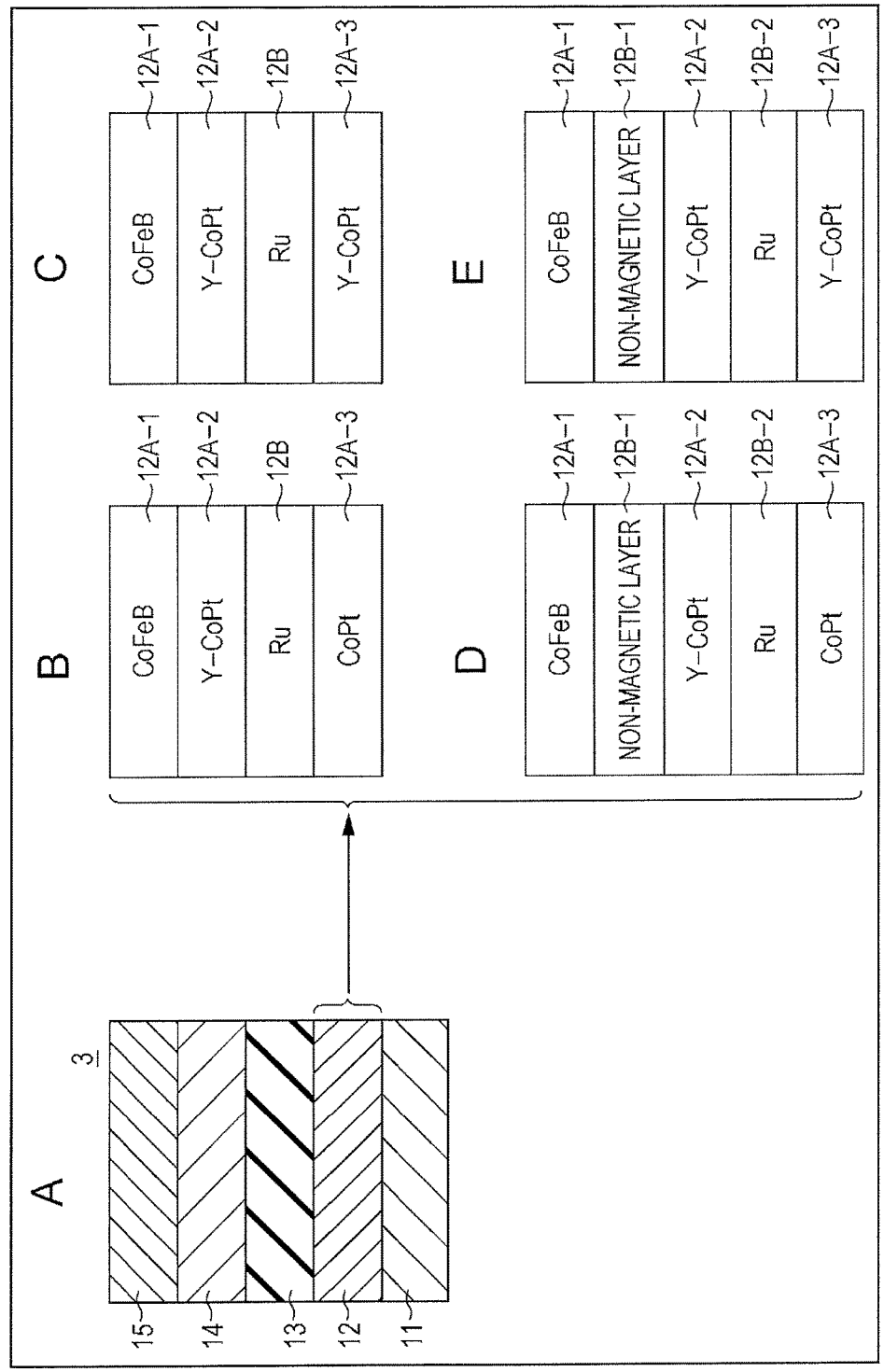

STORAGE ELEMENT, STORAGE DEVICE, AND MAGNETIC HEAD

TECHNICAL FIELD

The present technology relates to a storage element and a storage device which have a plurality of magnetic layers and perform storage using spin torque magnetization reversal. In addition, the technology also relates to a magnetic head which detects a magnetic signal from a magnetic recording medium.

CROSS REFERENCE TO RELATED APPLICATIONS

This application claims the benefit of Japanese Priority Patent Application JP 2013-223352 filed Oct. 28, 2013, the entire contents of which are incorporated herein by reference.

BACKGROUND ART

With a rapid development of various information appliances from mobile terminals to large-capacity servers, even higher performance, such as higher integration, faster speed, and reduced power consumption, has been sought for components like memory and logic elements used to configure such appliances. In particular, a significant advance has been made in a non-volatile semiconductor memory, and a flash memory as a large-capacity file memory is increasingly widespread and is forced to take the place of hard disk drives.

Meanwhile, regarding expansion to code storage and even to a working memory, the development of non-volatile semiconductor memories is also advancing so as to replace an NOR flash memory, a DRAM, and the like that are currently commonly used. For example, Ferroelectric Random Access Memory (FeRAM), Magnetic Random Access Memory (MRAM), Phase Change RAM (PCRAM), and the like can be exemplified as the non-volatile semiconductor memories. Some of these have already been commercialized.

Among these non-volatile memories, MRAM stores data using a magnetization direction of a magnetic material, and is therefore capable of fast-speed rewriting and nearly infinite rewriting ($10^{15}$ times or more). MRAM is already used in fields such as industrial automation or aviation.

Due to its fast-speed operation and reliability, there are high expectations for future use of MRAM as code storage and working memory.

However, reducing power consumption and increasing capacity remain as issues for MRAM.

These are important problems due to a storage principle of MRAM, that is, a method by which magnetization is reversed using a current magnetic field generated from the wiring.

As a method of solving this problem, storage methods (that is, magnetization reversal) that do not rely on a current magnetic field are being studied, and among them, research relating to spin torque magnetization reversal is actively ongoing (refer to, for example, PTL 1, PTL 2, PTL 3, NPL 1, and NPL 2).

Hereinafter, an MRAM which uses spin torque magnetization reversal is referred to as a Spin Torque Transfer based Magnetic Random Access Memory (STT-MRAM). Spin torque magnetization reversal is sometimes also referred to as spin injection magnetization reversal.

STT-MRAM comes in two types which are an in-plane magnetization type and a perpendicular magnetization type. Among them, in recent years, a perpendicular magnetization type of STT-MRAM which is more suitable for scaling is actively being developed.

For example, according to NPL 3, it has been suggested that using a perpendicular magnetization film such as a Co/Ni multilayer film in the storage layer makes it possible both to reduce the reversal current and to ensure thermal stability.

CITATION LIST

Patent Literature

PTL 1: Japanese Unexamined Patent Application Publication No. 2003-17782
PTL 2: U.S. Pat. No. 6,256,223
PTL 3: Japanese Unexamined Patent Application Publication No. 2008-227388
PTL 4: Japanese Unexamined Patent Application Publication No. 2010-80746

Non Patent Literature

NPL 1: Phys. Rev. B, 54, 9353(1996)
NPL 2: J. Magn. Mat., 159, L1(1996)
NPL 3: Nature Materials, 5, 210(2006)
NPL 4: Phys. Rev. Lett., 67, 3598(1991)

SUMMARY OF INVENTION

Technical Problem

Compared to a MRAM in the related art, the storage element in STT-MRAM is advantageous for scaling. In other words, it is possible to reduce the volume of the storage layer. However, a reduced volume generally lowers thermal stability of a magnetic material, and this causes failure in a memory operation.

For this reason, it is important to increase stability of a memory operation in a minute device so as to reduce an element size (further, expansion of memory capacity).

It is desirable to further reduce write errors caused by spin torque fluctuation in a storage element such as a STT-MRAM, and to improve stability of an information write operation of a memory in a minute device.

Solution to Problem

In one example, a storage element having a layered structure and being configured for storing information is disclosed. In one example, the storage element comprises a storage portion with a storage magnetization that is perpendicular to a film surface of the layered structure, wherein a direction of the storage magnetization is configured to change according to the information. The storage element also includes a fixed magnetization portion with reference magnetization serving as a reference to the storage magnetization, and an intermediate portion between the storage portion and the fixed magnetization portion that is made of a non-magnetic material. The fixed magnetization portion includes a laminated ferrimagnetic structure that comprises a first ferromagnetic layer, a second ferromagnetic layer, and a non-magnetic layer. The fixed magnetization portion includes a first magnetic material that is an alloy or a laminated structure including Pt, Co, and Y.

Storage devices including the storage element are also disclosed. According to one embodiment, this may be provided as a storage element which includes a layered structure including a storage layer that has magnetization perpendicular to a film surface thereof and in which the direction of the magnetization is changed corresponding to information, a magnetization fixed layer that serves as a reference for information stored in the storage layer and has magnetization perpendicular to a film surface, and an intermediate layer that is provided between the storage layer and the pinned magnetization layer and is made of a non-magnetic material. A direction of magnetization of the storage layer is changed and information is stored in the storage layer by injecting spin-polarized electrons in a lamination direction of the layered structure. Also, the magnetization fixed layer has a laminated ferrimagnetic structure made of at least two ferromagnetic layers and a non-magnetic layer, and a magnetic material which is an alloy or a laminated structure using Pt and Co, and includes Y is used as a magnetic material in the magnetization fixed layer.

That is, the possibility of a write error caused by spin torque fluctuation is reduced by using a magnetization fixed layer of a laminated ferrimagnetic structure which has a high coupling field in a STT-MRAM storage element. By adding Y thereto, to increase a coupling field of the laminated ferrimagnetic structure compared to when using a CoPt single material, for example, it is considered that Y becomes Co—Y, and perpendicular magnetic anisotropy caused by the Co—Y is expressed.

In the storage element according to the embodiment of the present technology, a magnetic material that is an alloy or a laminated structure using Pt and Co and includes Y is used as a magnetic material which is not in contact with the intermediate layer in the magnetization fixed layer.

In the storage element according to the embodiment of the present technology, it is preferable that an addition amount of the Y element be 12 at % (atomic percent) or less.

In the laminated ferri-pinned structure described above, when the addition amount of Y is in a range of 12 at % or less, a higher coupling field than when Y is not added is obtained.

In the storage element according to the embodiment of the present technology, it is preferable that the addition amount of the Y element be 1 at % to 10 at %.

In the laminated ferri-pinned structure described above, when the addition amount of the Y is in a range of 1 at % to 10 at %, even higher coupling field or an appropriate resistance change rate is obtained.

In the storage element according to the embodiment of the present technology, it is preferable that a magnetic material which is in a contact with the intermediate layer in the magnetization fixed layer be configured to have a CoFeB magnetic layer.

According to another embodiment of the present technology, there is provided a storage element which includes a layered structure including a storage layer that has magnetization perpendicular to a film surface and in which a direction of the magnetization is changed according to information, a magnetization fixed layer that has magnetization serving as a reference of information stored in the storage layer and perpendicular to a film surface, and an intermediate layer that is provided between the storage layer and the magnetization fixed layer and is made of a non-magnetic material, in which a direction of magnetization of the storage layer is changed and information is stored in the storage layer by injecting spin-polarized electrons in a lamination direction of the layered structure, and a magnetic material which is an alloy or a laminated structure using Pt and Co, and includes Y is used as a magnetic material in the magnetization fixed layer.

In this case, it is desirable that an addition amount of the Y element be 12 at % or less, and it is further desirable that the addition amount of the Y element be 1 at % to 10 at %.

According to still another embodiment of the present technology, there is provided a storage device which includes a storage element holding information in a magnetization state of a magnetic material, and two types of wiring intersecting with each other. The storage element has the configuration in which the storage element is disposed between the two types of wiring, the current in the lamination direction flows to the storage element through the two types of wiring, and spin-polarized electrons are injected.

According to still another embodiment of the present technology, there is provided a magnetic head, including the same configuration as the storage element described above.

Advantageous Effects of Invention

According to the embodiments of the present technology, it is possible to improve stability of an information write operation of a memory in a minute device by increasing a coupling field of a laminated ferri-pinned structure of a magnetization fixed layer and by reducing a write error caused by spin torque fluctuation without sacrificing the resistance change rate.

In the magnetic head according to the embodiment of the present technology that uses a structure of the storage element of the technology, it is possible to realize a highly reliable magnetic head with excellent thermal stability.

Effects described herein are not limited, and may be any effect described in the present disclosure.

BRIEF DESCRIPTION OF DRAWINGS

FIG. 8 is a diagram which describes a configuration of the magnetization fixed layer of a storage element according to an embodiment as a modification example.

DESCRIPTION OF EMBODIMENTS

Hereinafter, embodiments will be described in the following order.
<1. Configuration of a storage device according to an embodiment>
<2. Configuration of a storage element according to an embodiment>
<3. Experimental results>
<4. Modification examples>

1. Configuration of a Storage Device According to an Embodiment

First, a schematic configuration of a storage device will be described.

Figure 1:
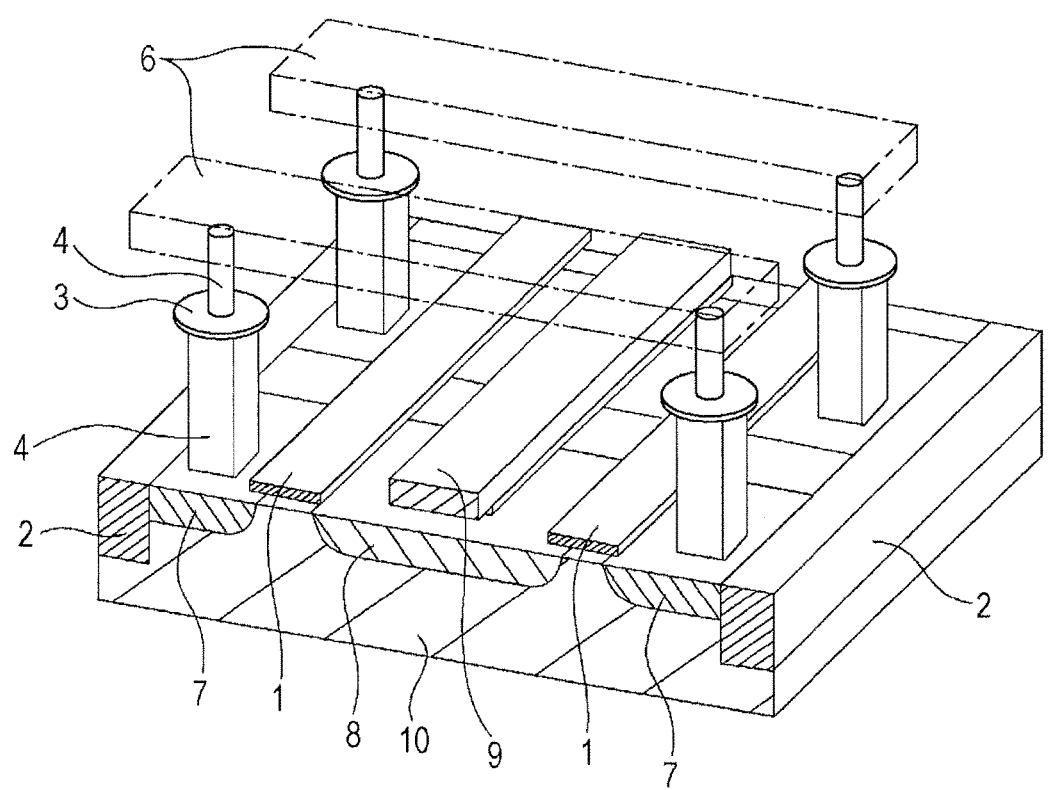
FIG. 1 is a schematic perspective view of a storage device according to an embodiment.
Figure 2:
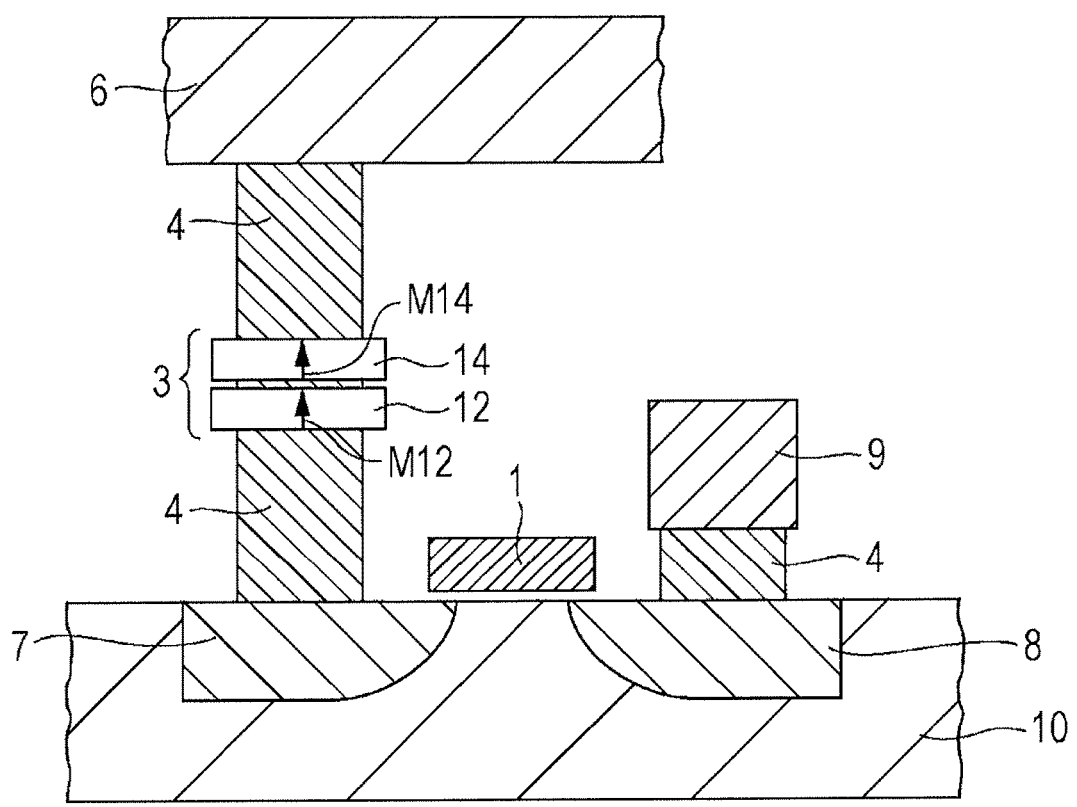
FIG. 2 is a cross-sectional view of a storage device according to an embodiment.
Figure 3:
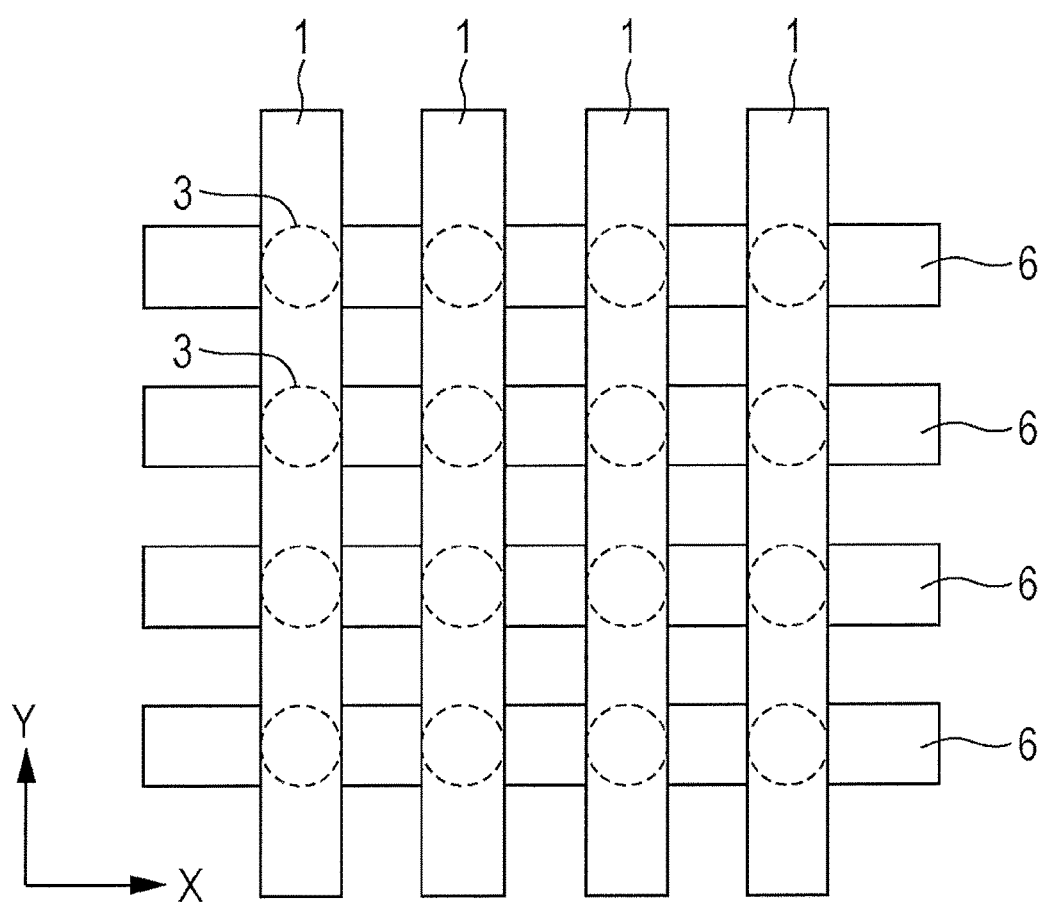
FIG. 3 is a plan view of a storage device according to an embodiment.

A schematic view of the storage device is shown in FIGS. 1, 2, and 3. FIG. 1 is a perspective view, FIG. 2 is a cross-sectional view, and FIG. 3 is a plan view.

As shown in FIG. 1, a storage device according to the embodiment has storage elements 3 that use a Spin Transfer Torque-based Magnetic Random Access Memory (STT-MRAM) capable of holding information in a magnetization state in the vicinity of intersections of two types of address wiring (for example, word lines and bit lines) which intersect with each other.

That is, a drain region 8, a source region 7, and a gate electrode 1 which configure a selection transistor for selecting each storage element 3 are formed, respectively, at a portion separated by an element separating layer 2 of the semiconductor substrate 10 such as a silicon substrate and the like. Among them, the gate electrode 1 also serves as one address wiring (word line) extending in a front and rear direction in the figure.

The drain region 8 is formed so as to be shared by the right and left selection transistors in FIG. 1, and a wiring 9 are connected to the drain region 8.

A storage element 3 which has a storage layer in which direction of magnetization is reversed by spin torque magnetization reversal is disposed between the source region 7 and a bit line 6 disposed upside extending in a horizontal direction in FIG. 1. The storage element 3 is configured to have, for example, a magnetic tunnel junction element (MTJ element).

The storage element 3 such as an STT-MRAM which uses the MTJ element of the embodiment uses a torque (also referred to as "spin torque") applied to another free magnetic layer (direction of magnetization is not fixed) when spin-polarized electrons, which pass through a magnetic layer that is fixed in a certain direction, enter the free magnetic layer. Accordingly, the free magnetic layer is reversed when a current of a given threshold or larger flows therein. Rewriting of 0/1 is performed by changing a polarity of the current.

An absolute value of a current for such reversal is 1 mA or below for an element of a scale of around 0.1 micrometer. Since such a current value decreases in proportion to an element volume, scaling is also possible. In addition, since word lines for generating a storage current magnetic field that are necessary for a MRAM are unnecessary, there is a further advantage in that a cell structure becomes simplified.

Such an STT-MRAM is used as a nonvolatile memory capable of reducing power consumption and increasing capacity while maintaining the advantages of MRAM, i.e., fast speed and nearly infinite rewrites.

As shown in FIG. 2, the storage element 3 has two magnetic layers 12 and 14. Among these two magnetic layers 12 and 14, one magnetic layer is set to be a magnetization fixed layer 12 in which direction of the magnetization M12 is fixed, and the other magnetic layer is set to be a free magnetization layer, that is, a storage layer 14, in which direction of a magnetization M14 is changed.

In addition, the storage element 3 is connected to the bit line 6 and the source region 7 through respective upper and lower contact layers 4.

Accordingly, by allowing a current to flow in a vertical direction (lamination direction) to the storage element 3 through two types of address wiring 1 and 6, it is possible to reverse direction of magnetization M14 of the storage layer 14 by the spin torque magnetization reversal.

As shown in FIG. 3, a storage device is configured to have a storage element 3 disposed at respective intersections of a plurality of first wiring (word lines) 1 and second wiring (bit lines) 6, which are orthogonally disposed in a matrix form.

A planar shape of the storage element 3 is assumed to be a circular shape as an example, and has a cross-sectional structure as shown in FIG. 2.

Moreover, the storage element 3 has the magnetization fixed layer 12 and the storage layer 14 as shown in FIG. 2.

Further, a memory cell of the storage device is configured to have each storage element 3.

Here, in such a storage device, since it is known that writing has to be performed with a current of a saturation current or less of a selected transistor, and the saturation current of a transistor decreases as the transistor is miniaturized, in order to enable miniaturization of the storage device, it is appropriate to improve the transfer efficiency of spin torque so as to reduce the current supplied to the storage element 3.

In addition, in order to increase a read signal, it is necessary to ensure a large magnetic resistance change rate, and therefore it is effective to adopt the MTJ structure as described above, that is, to have a configuration of the storage element 3 which sets an intermediate layer between two magnetic layers 12 and 14 to be a tunnel insulating layer (tunnel barrier layer).

An advantage of adopting the MTJ structure is that it is possible to increase a read signal by ensuring a large magnetic resistance change rate.

When using the tunnel insulating layer as an intermediate layer in this manner, in order to prevent an insulation breakdown of the tunnel insulating layer, limitation of an amount of current flowing in the storage element 3 occurs. That is, in terms of ensuring reliability with respect to repeatedly writing in the storage element 3, it is preferable to suppress a current necessary for the spin torque magnetization reversal. The current necessary for the spin torque magnetization reversal is referred to as a reverse current, a storage current, and the like.

In addition, there are two types of in-plane and perpendicular magnetizations for the STT-MRAM. However, a perpendicular magnetization type of STT-MRAM more suitable for scaling is used in the embodiment. Using a perpendicular magnetization film for the storage layer 14 is advantageous to ensure compatibility of reduction of the reverse current and thermal stability.

The storage element 3 (STT-MRAM) of the storage device is advantageous in scaling compared to a MRAM in the related art, that is, it is possible to make volume smaller. However, making volume smaller causes thermal stability of magnetization to be lowered.

When the STT-MRAM becomes large in capacity, the volume of the storage element 3 becomes even smaller. Therefore, it is an important task to ensure stability of a memory operation.

2. Configuration of a Storage Element According to an Embodiment

Next, a configuration of the storage element 3 of the embodiment will be described referring to FIGS. 4A and 4B.

Figure 4:
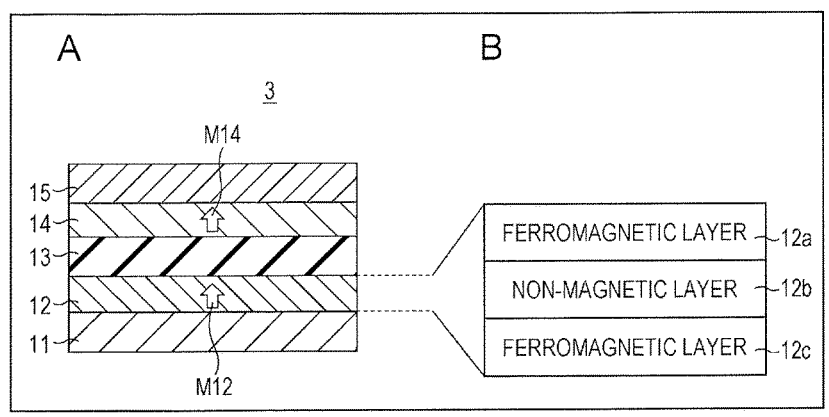
FIG. 4 is a diagram which describes a configuration of a storage element according to an embodiment.

As shown in FIG. 4A, the storage element 3 is made by laminating the magnetization fixed layer (also referred to as a reference layer) 12 in which direction of the magnetization M12 is fixed, an intermediate layer (non-magnetic layer: tunnel insulating layer) 13, the storage layer (free magnetization layer) 14 in which a direction of the magnetization M14 is variable, and the cap layer 15 on the base layer 11 in the same order.

The storage layer 14 has the magnetization M14 which is perpendicular to a film surface, and a direction of the magnetization is changed according to information.

The magnetization fixed layer 12 has the magnetization M12 which is a basis for information stored in the storage layer 14 and is perpendicular to a film surface. In the magnetization fixed layer 12, direction of the magnetization M12 is fixed by high coercivity and the like.

The intermediate layer 13 is a non-magnetic material and is provided between the storage layer 14 and the magnetization fixed layer 12.

By injecting spin-polarized electrons in a lamination direction of a layered structure which has the storage layer 14, the intermediate layer 13, and the magnetization fixed layer 12, direction of a magnetization of the storage layer 14 is changed and information is stored in the storage layer 14.

The base layer 11 and the cap layer 15 are used as an electrode, and function as a protection layer.

Here, the spin torque magnetization reversal will be simply described.

Electrons have two types of spin angular momentum. Assume that such types are defined as "upward" and "downward". In a non-magnetic material, both types are equal in number, while there is a difference in the number of the both types in a ferromagnetic material. A case is considered where electrons are caused to move from the magnetization fixed layer 12 to the storage layer 14 when respective magnetic moments are in opposite directions (antiparallel) in the magnetization fixed layer 12 and the storage layer 14 which are two layers of ferromagnetic material that configure an STT-MRAM.

The magnetization fixed layer 12 is a fixed magnetic layer in which direction of magnetic moment is fixed due to a high coercivity.

The electrons passing through the magnetization fixed layer 12 are spin-polarized, that is, the number of the upwards is different from the number of the downwards. When a thickness of the intermediate layer 13 which is a non-magnetic layer is configured to be sufficiently thin, the electrons reach another magnetic material, that is, the storage layer 14, before spin-polarization by the passage of the magnetization fixed layer 12 is relaxed to cause the electrons to be in a non-polarized state (the number of upwards is the same as the number of downwards) in a normal non-magnetic material.

Since a sign of spin polarization is opposite in the storage layer 14, to reduce the system energy, some of the electrons are reversed, that is, a direction of spin angular momentum is changed. At this time, since it is necessary for the total angular momentum of the system to be preserved, a reaction equivalent to a total of the change in angular momentum caused by the electrons whose direction is changed is also applied to the magnetic moment of the storage layer 14.

When a current, that is, the number of electrons that pass through per unit of time, is low, since the total number of electrons whose direction changes is also small, a change in angular momentum produced in the magnetic moments of the storage layer 14 is also small. However, when the current increases, it is possible to apply a large change in angular momentum within a unit of time.

When a time change in the angular momentum is torque, and the torque exceeds any threshold value, a magnetic moment of the storage layer 14 starts precession, and becomes stable at a position rotated by 180 degrees by the uniaxial anisotropy. That is, a reversal occurs from the opposite direction to the same direction (parallel).

When the magnetization is in the same direction, a current flows in the opposite direction so as to send electrons from the storage layer 14 to the magnetization fixed layer 12, and when electrons that are spin reversed upon being reflected by the magnetization fixed layer 12 apply torque when entering the storage layer 14, it is possible to reverse the magnetic moment to the opposite direction. However, at this time, an amount of current necessary to cause reversal is larger than when reversing from the opposite direction to the same direction.

Although it is difficult to intuitively understand reversal of a magnetic moment from the same direction to the opposite direction, it may be considered that the magnetic moment of the magnetization fixed layer 12 may not be reversed because the magnetization fixed layer 12 is fixed, and therefore the storage layer 14 is reversed to preserve the angular momentum of the entire system.

In this manner, storage of 0/1 is performed by causing a current that corresponds to the respective polarities and is equal to or larger than a certain threshold to flow in a direction from the magnetization fixed layer 12 to the storage layer 14 or in the opposite direction.

Meanwhile, reading of information is performed using the magneto resistance effect in the same way as with existing MRAM. That is, current flows in the direction perpendicular to the film surfaces in the same manner as the storage described above. A phenomenon in which the electrical resistance indicated by the element changes according to whether a magnetic moment of the storage layer 14 is in the same direction as, or in the opposite direction to, a magnetic moment of the magnetization fixed layer 12 is used.

A material used as the intermediate layer 13 between the magnetization fixed layer 12 and the storage layer 14 may be a metal or may be an insulator. However, a higher read signal (resistance change rate) is obtained and storage can be performed using a lower current when using an insulator as the intermediate layer. An element at this time is referred to as a ferromagnetic tunnel junction (Magnetic Tunnel Junction: MTJ).

In a case of a perpendicular magnetization type storage element, when reversing direction of magnetization of a magnetic layer by the spin torque magnetization reversal, a threshold value Ic of a necessary current is expressed by the following Equation 1.

$$I_C = \left(\frac{4ek_BT}{\hbar}\right)\left(\frac{\alpha\Delta}{\eta}\right) \quad \text{[Math. 1]}$$

However, e is a charge of the electrons, an eta is a spin injection efficiency, h with a bar is a conversion of Planck's constant, an alpha is a damping constant, $k_B$ is a Boltzmann's constant, and T is temperature.

Here, in order to be able to exist as a memory, it is necessary to hold information written in the storage layer 14. The ability to hold information is determined by a value of the index delta (=KV/$k_B$T) of thermal stability. The delta is expressed by Equation 2 below.

$$\Delta = \frac{KV}{k_BT} = \frac{M_sVH_k}{2k_BT} \quad \text{[Math. 2]}$$

Here, K is the anisotropic energy, Hk is the effective anisotropic magnetic field, $k_B$ is the Boltzmann's constant, T is temperature, Ms is an amount of the saturation magnetization, and V is a volume of the storage layer.

The effective anisotropic magnetic field Hk is affected by shape magnetic anisotropy, induced magnetic anisotropy, crystal magnetic anisotropy, and the like, and is equal to the coercivity when assuming a coherent rotation model with a single magnetic domain.

In many cases, an index delta of thermal stability and a current threshold value Ic are basically in a trade-off relationship. For this reason, in order to maintain memory characteristics, compatibility of these is a problem to be solved.

Here, when a spin torque magnetization reversal is performed, since a current directly flows to the storage element 3 to perform writing (storage) of information, a memory cell is configured by connecting the storage element 3 to a selection transistor so as to select a memory cell on which writing is to be performed.

In this case, the current flowing in the storage element 3 is limited by a magnitude of the current capable of flowing in the selection transistor (a saturation current of the selection transistor).

It is desirable to adopt a perpendicular magnetization type as described above to reduce the storage current. Since a perpendicular magnetization film is generally capable of having higher magnetic anisotropy than an in-plane magnetization film, this is also preferable in maintaining a high value for delta described above.

There are several types of perpendicular magnetic materials such as rare earth-transition metal alloys (TbCoFe and the like), metal multilayer films (a Co/Pd multilayer film and the like), ordered alloys (FePt and the like), using interface anisotropy between an oxide and a magnetic metal (Co/MgO and the like). However, since the rare earth-transition metal alloys lose their perpendicular magnetic anisotropy when diffused and crystallized by heating, such alloys are not preferable as an STT-MRAM material. It is known that the metal multilayer films are also diffused by heating to cause deterioration in the perpendicular magnetic anisotropy, and since such perpendicular magnetic anisotropy is expressed to be (111) the direction of a face-centered cubic, it is difficult to realize the (001) direction desired for a high polarization layer of MgO, or Fe, CoFe, CoFeB or the like disposed adjacent to the MgO. An L10 ordered alloy is stable at a high temperature and exhibits perpendicular magnetic anisotropy with a (001) direction, which means that the above problem does not occur, but it is necessary to regularly align the atoms either by heating to a sufficiently high temperature of 500 degrees Celsius or above during manufacturing or by performing a heat treatment at a high temperature of 500 degrees Celsius or above after manufacturing, which has the risk of causing undesired diffusion in other parts of the laminated film, such as the tunnel barrier, and increasing interface roughness.

Conversely, a material that uses interface magnetic anisotropy, that is, a material made by laminating a Co-based material or an Fe-based material on MgO that is a tunnel barrier is not susceptible to any of the above problems, and for that reason, is promising as a storage layer material of the STT-MRAM.

Meanwhile, it is desirable to use a perpendicular magnetization magnetic material with interface magnetic anisotropy in the magnetization fixed layer 12. In particular, in order to provide a strong read signal, a material made by laminating a magnetic material including Co or Fe below the MgO that is a tunnel barrier is desirable.

In the embodiment, the storage layer 14 is a CoFeB perpendicular magnetization film.

Furthermore, in consideration of a saturation current value of the selection transistor, a magnetic tunnel junction (MTJ) element using a tunnel insulating layer made of an insulator is configured as the non-magnetic intermediate layer 13 between the storage layer 14 and the magnetization fixed layer 12.

By configuring the magnetic tunnel junction (MTJ) element using a tunnel insulating layer, compared to a case where a giant magneto resistance effect (GMR) element is configured using a non-magnetic conductive layer, it is possible to increase a rate of change in magneto resistance (MR ratio) and is possible to increase the read signal intensity.

Then, in particular, by using magnesium oxide (MgO) as the material of the intermediate layer 13 as the tunnel insulating layer, it is possible to increase the rate of change in magneto resistance (MR ratio).

A transfer efficiency of spin torque generally depends on the MR ratio, and as the MR ratio gets higher, the transfer efficiency of the spin torque is improved, and thereby it is possible to reduce a magnetization reverse current concentration.

Accordingly, by using a magnesium oxide as a material of the tunnel insulating layer and at the same time by using the storage layer 14 described above, it is possible to reduce a write threshold current using the spin torque magnetization reversal, and thereby it is possible to perform writing (storage) of information with a small current. In addition, it is possible to increase the read signal intensity.

By doing so, it is possible to ensure the MR ratio (TMR ratio) and to reduce the write threshold current using the spin torque magnetization reversal, and thereby it is possible to perform writing (storage) of information with a small current. It is also possible to increase the read signal intensity.

When the tunnel insulating layer is formed of a magnesium oxide (MgO) film in this manner, the MgO film is crystallized, and therefore it is more desirable to keep the crystal direction in the (001) direction.

In the embodiment, in addition to having a configuration made from a magnesium oxide as described above, the intermediate layer 13 between the storage layer 14 and the magnetization fixed layer 12 can be configured using various types of insulators, dielectrics, and semiconductors such as aluminum oxide, aluminum nitride, SiO$_2$, Bi$_2$O$_3$, MgF$_2$, CaF, SrTiO$_2$, AlLaO$_3$, Al—N—O, and the like.

From a viewpoint of obtaining a current density necessary to reverse the direction of magnetization of the storage layer 14 using the spin torque magnetization reversal, it is desirable to control an areal resistance value of the intermediate layer (tunnel insulating layer) 13 to around several tens of ohm-square micrometers or less.

Then, in order to set the areal resistance value of the tunnel insulating layer made of an MgO film in the range described above, it is desirable to set a thickness of the MgO film to 1.5 nm or below.

Additionally, in the storage element 3 according to the embodiment, the cap layer 15 is disposed adjacent to the storage layer 14.

The cap layer 15 is made of oxide.

As the oxide of the cap layer 15, for example, MgO, aluminum oxide, TiO$_2$, SiO$_2$, Bi$_2$O$_3$, SrTiO$_2$, AlLaO$_3$, Al—N—O, and the like are used.

Here, in the storage element 3, although it would be conceivable to adopt a single layered structure as a structure of the magnetization fixed layer 12, it is effective to adopt a laminated ferri-pinned structure made of two or more ferromagnetic layers and a non-magnetic layer. By using the laminated ferri-pinned structure for the magnetization fixed layer 12, it is possible to easily cancel asymmetry with respect to a direction of writing information on thermal stability, and to improve stability with respect to spin torque.

For this reason, in the embodiment, it is assumed that the magnetization fixed layer 12 has a laminated ferri-pinned structure. That is, for example, as shown in FIG. 4B, the magnetization fixed layer 12 is the laminated ferri-pinned structure which is made of at least two ferromagnetic layers 12a and 12c, and a non-magnetic layer 12b.

Then, in the embodiment, a magnetic material such as a ferromagnetic layer 12c which is not in contact with the intermediate layer 13 among magnetic materials in the magnetization fixed layer 12 is set as a magnetic material which is an alloy or a laminated structure using Pt (platinum) and Co (cobalt), and to which Y (yttrium) is added.

Accordingly, a coupling field of the laminated ferri-pinned structure is higher than when not using a single material of Co—Pt as the ferromagnetic layer 12c, and it is possible to stabilize an information write operation of a memory without reducing the resistance change rate.

Here, for the following reasons, Y is focused on as an additional material to the Co—Pt.

One of reasons to select the Co—Pt as a magnetic material of the ferromagnetic layer 12c which is not in contact with the intermediate layer 13 in the magnetization fixed layer 12 in the embodiment is that a thin film with a high perpendicular magnetic anisotropy energy can be created in a relatively easy manner.

On the other hand, a Co-rare earth system [Y, lanthanoid] exists as a material with a high perpendicular magnetic anisotropy energy.

It is considered that the origins of high perpendicular magnetic anisotropy energy in Co-rare earth-based materials and Co—Pt are different. However, among the rare earth material, if Y is present closest to the Co in terms of the periodic table, without disturbing the state of Co that expresses high perpendicular magnetic anisotropy in the Co—Pt, it can be estimated that high perpendicular magnetic anisotropy which is caused by the Co-rare earth system can be provided.

Based on this point, in the storage element 3 of the embodiment, the magnetization fixed layer 12 is configured as follows.

That is, the magnetization fixed layer 12 includes a laminated ferri-pinned structure made of at least two ferromagnetic layers 12a and 12c, and a non-magnetic layer 12b.

A magnetic material of the ferromagnetic layer 12a which is in contact with the intermediate layer 13 among magnetic materials of the magnetization fixed layer 12 is assumed to be CoFeB.

In addition, a magnetic material of the ferromagnetic layer 12c which is not in contact with the intermediate layer 13 is assumed to be an alloy or a laminated structure using Pt and Co, and to be an alloy or a laminated structure using Pt and Co with Y added. That is, a coupling field of the laminated ferri-pinned structure is larger than when using a single material of Co—Pt.

As a reason why a coupling field of the laminated ferri-pinned structure becomes larger by an addition of Y, for example, as described above, it is estimated that Y becomes Co—Y, and perpendicular magnetic anisotropy caused by the Co—Y is expressed.

Here, a single material such as Ru, Os, Rh, Ir, Cu, Ag, Au, Re, V, Nb, Ta, Cr, Mo, and W, a laminated film of two types elements or more, or an alloy can be used for a non-magnetic layer 12b in the magnetization fixed layer 12.

By using this configuration, it is possible to increase a coupling field of the laminated ferri-pinned structure in the magnetization fixed layer 12 and to increase stability of an information write operation of a memory in a minute device by reducing write errors due to spin torque fluctuation without sacrificing the resistance change rate.

Accordingly, it is possible to realize a storage device that operates stably and has high reliability.

Since the storage layer 14 is a perpendicular magnetization film, the storage element 3 according to the embodiment can reduce an amount of write current that is necessary to reverse the direction of magnetization M14 of the storage layer 14.

By reducing the write current in this manner, it is possible to reduce power consumption when performing writing in the storage element 3.

Here, it is possible to manufacture the storage elements 3 according to the embodiment as shown in FIGS. 4A and 4B by consecutively forming the base layer 11 to the metal cap layer 15 inside a vacuum device and then forming a pattern of the storage element 3 by processes such as etching and the like.

Accordingly, when manufacturing the storage device, there is an advantage that it is possible to use a typical semiconductor MOS formation process. That is, the storage device according to the embodiment can be used as a general-purpose memory.

In the storage element 3 according to the embodiment, it is also possible to add non-magnetic elements to the storage layer 14.

By adding different types of elements, effects such as improved heat resistance by preventing diffusion, an increased magneto resistance effect, and an increase in dielectric voltage associated with planarization are obtained. As a material of the added elements, it is possible to use B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os, or alloys and oxides of the same.

As the storage layer 14, it is also possible to directly laminate another ferromagnetic layer of a different composition. Alternatively, it is also possible to laminate a ferromagnetic layer and a soft magnetic layer, or to laminate a plurality of ferromagnetic layers to each other through the soft magnetic layer or the non-magnetic layer. The effects of the present disclosure are still achieved even when laminating is performed in this manner.

In particular, when a configuration is used in which a plurality of ferromagnetic layers are laminated through the non-magnetic layer, since it is possible to adjust the intensity of interactions between the ferromagnetic layers, an effect is that it is possible to suppress the magnetization reversal current not to be large. In such case, it is possible to use Ru, Os, Re, Ir, Au, Ag, Cu, Al, Bi, Si, B, C, Cr, Ta, Pd, Pt, Zr, Hf, W, Mo, Nb, and V, or an alloy of the same as a material of the non-magnetic layer.

It is desirable that the respective thicknesses of the magnetization fixed layer 12 and the storage layer 14 be in a range of 0.5 nm to 30 nm.

It is desirable to make the size of the storage element 3 small so as to make it possible to easily reverse the direction of magnetization of the storage layer 14 with a small current.

For example, it is desirable that the area of the storage element 3 be 0.01 square micrometer or smaller.

The other configurations of the storage element 3 can be the same as a general configuration of a storage element that stores information using the spin torque magnetization reversal.

For example, it is possible to adjust magnetic characteristics or to adjust the other various physical properties such as a crystal structure, crystallinity, stability of a material, or the like by adding non-magnetic elements such as Ag, Cu, Au, Al, Si, Bi, Ta, B, C, O, N, Pd, Pt, Zr, Ta, Hf, Ir, W, Mo, Nb, V, Ru, Rh, and the like to a magnetic material.

In addition, a film configuration (layered structure) of the storage element 3 may be a configuration in which the storage layer 14 is disposed at a lower side of the magnetization fixed layer 12.

3. Experimental Results

Experiment 1

With regard to a storage element 3 of the embodiment, in Experiment 1, in order to investigate magnetization reverse characteristics of the magnetization fixed layer 12, magnetic characteristics are investigated using a wafer which forms only samples in a configuration except for the storage element 3 of the storage layer 14.

Figure 5:
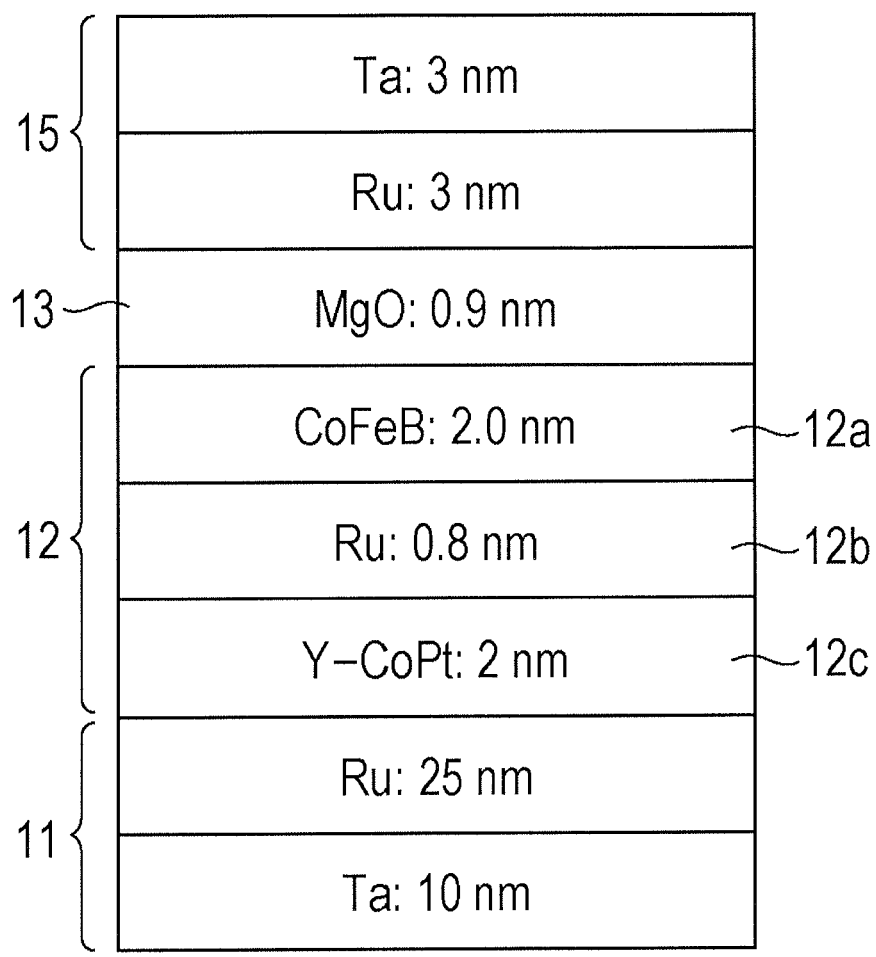
FIG. 5 is a diagram which describes a configuration of a sample used in Experiment 1.

Specifically, a thermal oxide film with a thickness of 300 nm is formed on a silicon substrate with a thickness of 0.725 mm, and the storage element 3 is formed using a structure shown in FIG. 5.

As shown in FIG. 5, a material and a film thickness of each layer which configures the magnetization fixed layer 12 are selected as follows.

Magnetization fixed layer 12: laminated film of Y-added CoPt: 2 nm/Ru:0.8 nm/CoFeB:2 nm
Perpendicular magnetization film in the magnetization fixed layer 12 is a CoPt film with a film thickness of 2 nm to which at % Y is added, and "x" is set in a range from 0 at % to 15 at %.

A material and a film thickness of each layer except for the magnetization fixed layer 12 are selected as follows.

Base layer 11: a laminated film made of a 10 nm-thick Ta film and a 25 nm-thick Ru film.
Intermediate layer (tunnel insulating layer) 13: a 0.9 nm-thick magnesium oxide film.
Cap layer 15: a laminated film made of 3 nm-thick Ru/3 nm-Ta.

After all of the films described above have been deposited, the samples of this experiment are subjected to heat treatment.

A composition of a CoFeB alloy of the magnetization fixed layer 12 is set at CoFe80% (Co30%-Fe70)-B20% (all at %).

The intermediate layer 13 made of a magnesium oxide (MgO) film is deposited using RF magnetron sputtering and the other films are deposited using DC magnetron sputtering.

Experiment 2

With regard to an entire configuration of the storage element 3 according to the embodiment, in Experiment 2, in order to investigate a resistance change rate, a resistance change rate and an information write error rate (WER) are investigated using a wafer which forms only the storage element 3.

Figure 6:
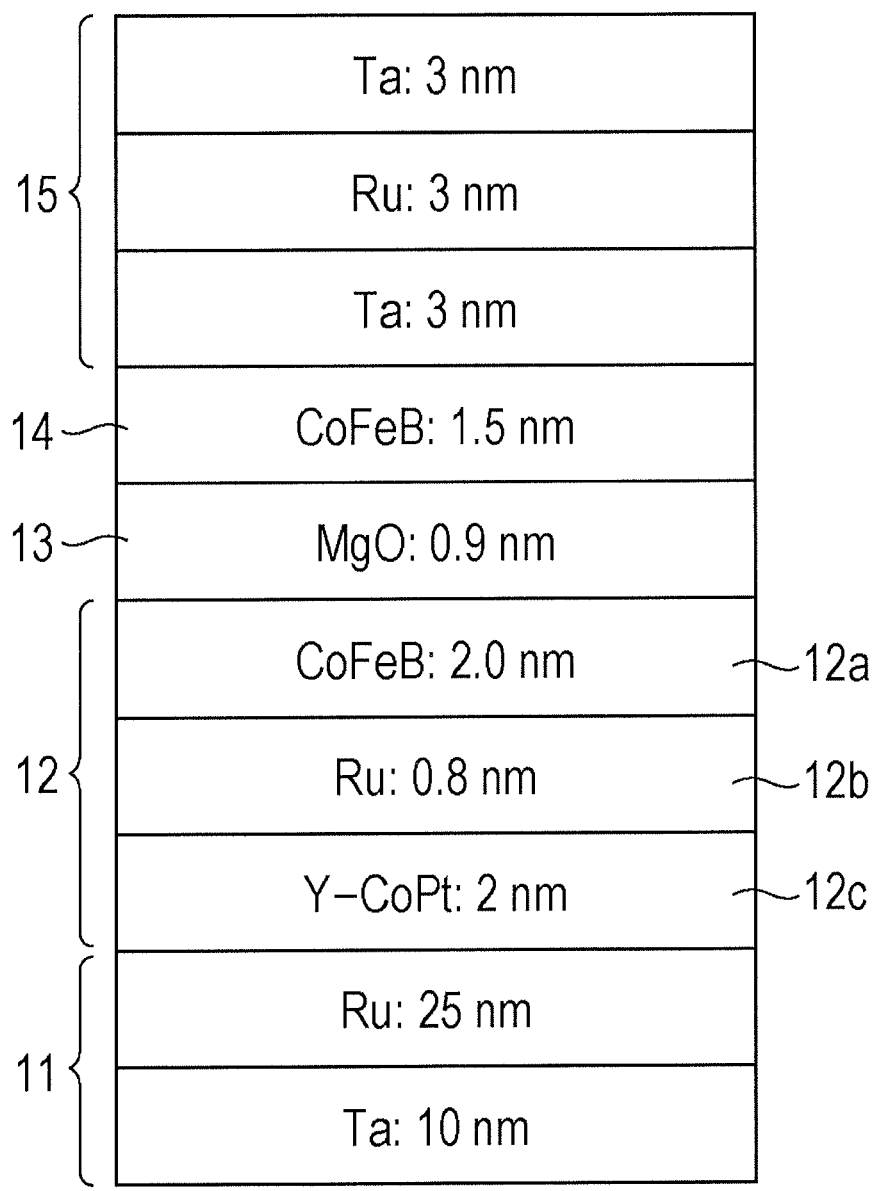
FIG. 6 is a diagram which describes a configuration of a sample used in Experiment 2.

Specifically, a thermal oxide film with a thickness of 300 nm is formed on a silicon substrate with a thickness of 0.725 mm, and the storage element 3 according to a structure shown in FIG. 6 is formed thereon.

As shown in FIG. 6, a material and a film thickness of each layer which configures the magnetization fixed layer 12 are selected as follows.

Magnetization fixed layer 12: a laminated film of Y-added CoPt:2 nm/Ru:0.8 nm/CoFeB:2 nm
A perpendicular magnetization film in the magnetization fixed layer 12 is a CoPt film with a thickness of 2 nm to which x at % of Y is added, and "x" is set to a range from 0 at % to 15 at %.

A material and a film thickness of each layer except for in the magnetization fixed layer 12 are selected as follows.

Base layer 11: a laminated film made of a 10 nm-thick Ta film and a 25 nm-thick Ru film.
Intermediate layer (tunnel insulating layer) 13: a 0.9 nm-thick magnesium oxide film
Storage layer 14: 1.5 nm: CoFeB.
Cap layer 15: a laminated film made of Ru:3 nm/Ta:3 nm.

After all of the films described above have been deposited, the samples of this experiment are subjected to heat treatment.

In the Experiment, a resistance change rate is measured after an element with a diameter of 50 nm phi is processed. The resistance change rate (%):TMR is calculated by an equation of TMR (%)=$(R_{AP}-R_P)/R_P \times 100$ ($R_P$ is a resistance value in a parallel state, $R_{AP}$ is a resistance value in an anti-parallel state) from a resistance difference between when the storage layer 14 and the magnetization fixed layer 12 are in a parallel [P] state to each other and when in an anti-parallel [AP] state.

Figure 7A:
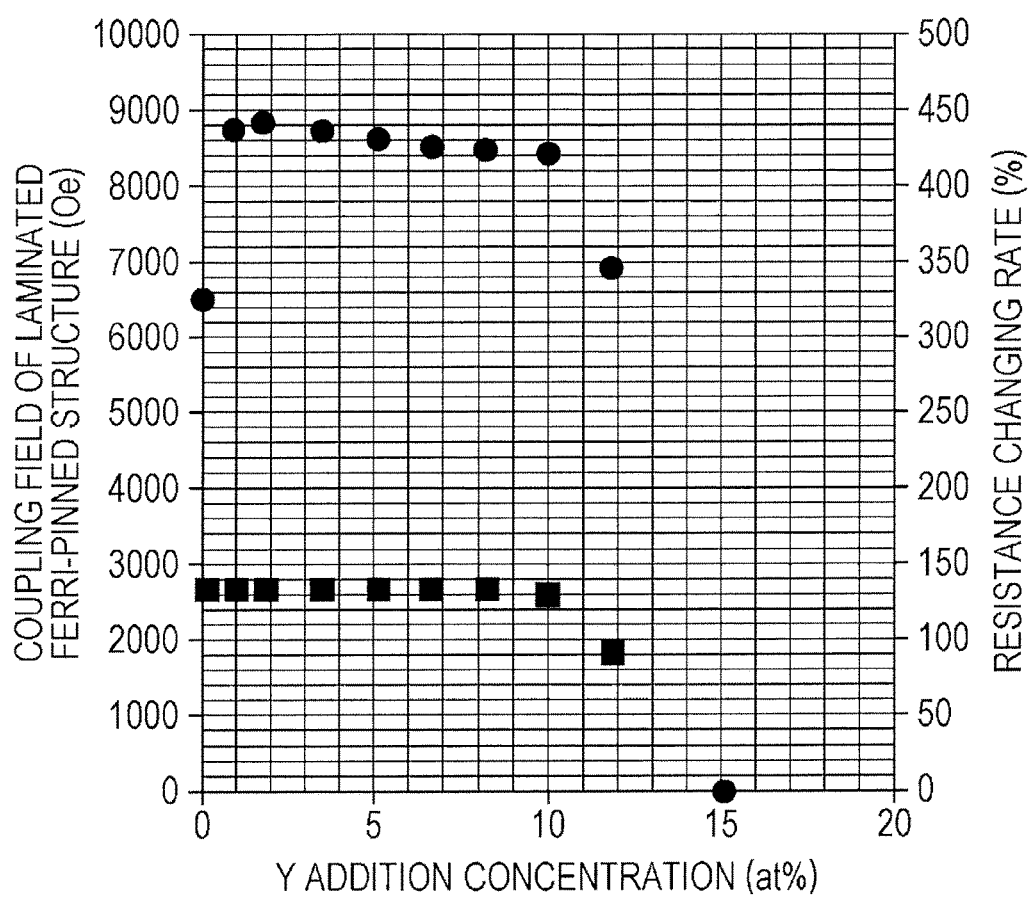
FIG. 7A is a diagram which describes a coupling field and a resistance change rate of a laminated ferri-pinned structure obtained from a VSM measurement result for each sample in Experiments 1 and 2.
Figure 7B:
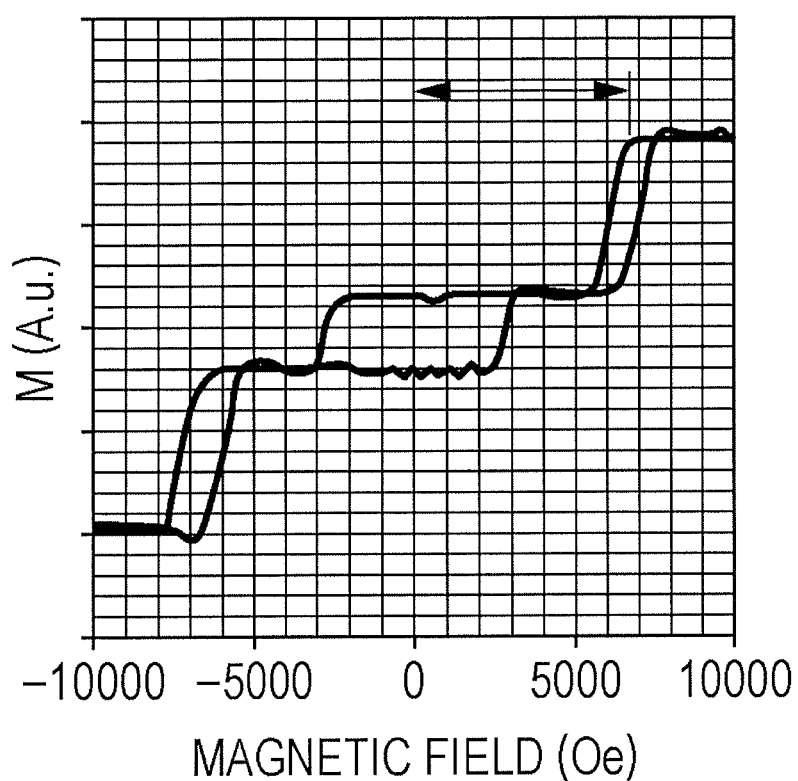
FIG. 7B is a diagram which describes a coupling field and a resistance change rate of a laminated ferri-pinned structure obtained from a VSM measurement result for each sample in Experiments 1 and 2.

FIG. 7A shows a result of measuring a coupling field and a resistance change rate of a laminated ferri-pinned structure of the magnetization fixed layer obtained from a result of measuring Vibrating Sample Magnetometer (VSM) performed in Experiments 1 and 2. FIG. 7B shows a coupling field when Y is not added (x=0).

First, a result of Experiment 1 will be initially described.

According to FIGS. 7A and 7B, a coupling field of the laminated ferri-pinned structure is 6.5 kOe (FIG. 7B) when using the Co—Pt single material. In contrast, as shown by black circle and a left vertical axis in FIG. 7A, by adding 1 at % Y to a Co—Pt, a coupling field of the laminated ferri-pinned structure is 8.85 kOe, and an increase of approximately 35% can be confirmed. Furthermore, it is known that a coupling field of the large laminated ferri-pinned structure is maintained in a range of an addition concentration of Y by 10 at %.

A reason for which a coupling field of a laminated ferri-pinned structure is increased by the addition of Y, is because it can be estimated that Y will become Co—Y and perpendicular magnetic anisotropy caused by the Co—Y will be expressed.

In the experiment, it is demonstrated that adding Y to a Co—Pt is effective to significantly increase a coupling field of the laminated ferri-pinned structure.

Furthermore, according to FIG. 7A, it can be confirmed that when an addition amount of Y exceeds 10 at %, a coupling field of the laminated ferri-pinned structure tends to be rapidly lowered. Y addition concentration dependence of a coupling field of the laminated ferri-pinned structure is intended to support the estimation mechanism described above, Y is added in excess, the state of Co in the Co—Pt changes. Therefore it can be estimated that perpendicular magnetic anisotropy of the Co—Pt is deteriorated.

From the above experimental results, it is shown that the addition of Y to the Co—Pt is a suitable additive element to enhance the coupling field of laminated ferri-pinned structure the magnetization fixed layer.

Next, a result of Experiment 2 will be described.

As shown by black square and a right vertical axis in FIG. 7A, it is known that the resistance change rate (TMR) is fixed to around 135% when the Y addition concentration is 10 at % or less, but is greatly lowered to 100% or less when the Y addition concentration is added up to 12 at %.

Such lowering of TMR corresponds to lowering of a coupling field of the laminated ferri-pinned structure due to excessive addition of Y.

Therefore, from a result of Experiments 1 and 2, an addition of Y to the Co—Pt is shown to be an appropriate additional element for increasing a coupling field of the laminated ferri-pinned structure of the magnetization fixed layer, and furthermore when an addition concentration of Y is 1 at % to 10 at %, it is shown that a coupling field of the large laminated ferri-pinned structure and a high resistance change rate are compatible.

Moreover, with regard to samples with an addition amount of 0 at %, 1 at %, 5 at %, 10 at %, 12 at % of Y among samples created in Experiment 2, measurement of information write error rate is performed. In an evaluation of the information write error rate (WER), a pulse voltage of 15 ns is applied, and an information write error occurring at this time is measured.

As a result, it is found that a magnitude of the coupling field of the laminated ferri-pinned structure greatly affects information write error characteristics in a minute device, and a reverse voltage at which WER becomes $10^{-7}$ is suppressed to be small when the addition amount of Y by which a coupling field of a large laminated ferri-pinned structure is obtained is in a range of 1 at % to 10 at %.

The WER necessary for an actual memory operation depends on a circuit, but is assumed to be $10^{-7}$ or less. Accordingly, an operation characteristic of a low WER is extremely important.

A reason for which a low WER is realized using a device having a coupling field of a large laminated ferri-pinned structure is as follows.

In the STT-MRAM, spin torque is used when writing information. An effect of the torque is mainly observed by the storage layer 14; however, affects the magnetization fixed layer 12. Here, when a device is large in size, magnetization of the storage layer 14 and the magnetization fixed layer 12 maintain high stability with respect to a thermal fluctuation, such that effects of the spin torque received by the magnetization fixed layer 12 can be ignored.

However, when the device size is, for example, 50 nm or below, effects of thermal fluctuation and effects of spin torque are superimposed on each other, such that the spin torque received by the magnetization fixed layer 12 may not be ignored.

Particularly, in a region of low WER, effects of the spin torque received by the magnetization fixed layer 12 are obvious, and if not sufficiently increased in a coupling field of the laminated ferri-pinned structure of the magnetization fixed layer 12, reverse effects can be seen in the form of an increase in an operation voltage, that is, an increase in power consumption, and a lowering in reliability of a memory operation.

Accordingly, when having a magnetization fixed layer which uses 1 at % to 10 at % Y added Co—Pt, and using a device with a high coupling field of a laminated ferri-pinned structure, it is possible to slightly stop the effects of the spin torque received by the magnetization fixed layer 12, such that it is estimated that a memory operation voltage in a low WER can be suppressed to be low.

Based on the above experimental results, a magnetic material which is not in contact with the insulation layer of the magnetization fixed layer 12 is assumed to be an alloy or a laminated structure using Pt and Co, and is assumed to be an alloy or a laminated structure using Pt and Co with Y applied thereto. In a memory element which has a higher coupling field in the laminated ferri-pinned structure than when using a single material of Co—Pt, the information write operation is stabilized without losing the resistance change rate.

In particular, it is desirable that an addition amount of a Y element be 12 at % (atomic percent) or less. By the experimental result shown in FIG. 7A, a higher coupling field is obtained than when Y is not added in a range in which Y addition amount is 12 at % or less in the laminated ferri-pinned structure.

Furthermore, it is desirable that an addition amount of a Y element be 1 at % to 10 at %. In the laminated ferri-pinned structure, when an addition amount of Y is in a range of 1 at % to 10 at %, a higher coupling field can be obtained and a desirable resistance change rate can be obtained. This is also appropriate for WER.

Although an experimental result in the magnetization fixed layer 12 of a configuration of Y-added CoPt/Ru/CoFeB has been shown, the magnetization fixed layer 12 can adopt the configuration shown in FIGS. 8A to 8E.

FIG. 8A shows a structure of the storage element 3 which is the same as in FIG. 4A.

Other structures of the magnetization fixed layer 12 are exemplified in FIGS. 8B to 8E in this case.

FIG. 8B is a configuration example which has a ferromagnetic layers 12A-1 and 12A-2, a non-magnetic layer 12B, and a ferromagnetic layer 12A-3 in an order as seen from the intermediate layer 13 side.

A ferromagnetic layer 12A-1 is set to be CoFeB, a ferromagnetic layer 12A-2 is set to be a Y-added CoPt, a non-magnetic layer 12B is set to be Ru, and a ferromagnetic layer 12A-3 is set to be CoPt.

FIG. 8C is a configuration example as in FIG. 8B which has the ferromagnetic layers 12A-1 and 12A-2, a non-magnetic layer 12B, and a ferromagnetic layer 12A-3 sequentially from the intermediate layer 13 side, and in this case, is an example which sets both ferromagnetic layers 12A-2 and 12A-3 to be a Y-added CoPt.

FIG. 8D is a configuration example in which a ferromagnetic layer and a non-magnetic layer such as a ferromagnetic layer 12A-1, a non-magnetic layer 12B-1, a ferromagnetic layer 12A-2, a non-magnetic layer 12B-2, a ferromagnetic layer 12A-3 are alternately laminated sequentially from the intermediate layer 13 side.

The ferromagnetic layer 12A-1 is set to be CoFeB, the ferromagnetic layer 12A-2 is set to be a Y-added CoPt, the non-magnetic layer 12B is set to be Ru, and the ferromagnetic layer 12A-3 is set to be CoPt.

FIG. 8E is a configuration example as in FIG. 8D in which a ferromagnetic layer and a non-magnetic layer such as the ferromagnetic layer 12A-1, the non-magnetic layer 12B-1, the ferromagnetic layer 12A-2, the non-magnetic layer 12B-2, and the ferromagnetic layer 12A-3 are alternately laminated in order from the intermediate layer 13 side. In this case, both the ferromagnetic layers 12A-2 and 12A-3 are set to be Y-added CoPt.

In these examples, the non-magnetic layer 12B-1 can also take on a configuration of Ta, Nb, Cr, W, Mo, V, Hf, Zr, Ti, and the like.

In addition, instead of Ru as the non-magnetic layers 12B and 12B-2, a single material of Os, Rh, Ir, Cu, Ag, Au, Re, V, Nb, Ta, Cr, Mo, and W, a laminated film of two types or more of elements, or an alloy can be used.

In the example in FIGS. 8A to 8E, the magnetization fixed layer 12 has a laminated ferri-pinned structure made of at least two layers of ferromagnetic layers, and a non-magnetic layer, and a magnetic material which is not in contact with the intermediate layer 13 in the magnetization fixed layer 12 is a material made by adding Y to an alloy or a laminated structure using Pt and Co. Accordingly, by increasing a coupling field of a laminated ferri-pinned structure of the magnetization fixed layer 12, a possibility of write error caused by spin torque fluctuation is reduced without sacrificing the resistance change rate. As a result, it is possible to increase stability of an information write operation of a memory in a minute device.

In the embodiments described above, an example of a magnetic material in the magnetization fixed layer 12 which is an alloy or a laminated structure using Pt and Co, and includes Y is described; however, a laminated structure of Pt, Co, and Y may be provided as a structure corresponding to an example of the magnetic material. That is, in a ferromagnetic layer 12c of FIGS. 4A and 4B or ferromagnetic layers 12A-2, 12A-3, and the like of FIGS. 8B to 8E, a structure in which a Pt layer, a Y layer, and a Co layer are laminated is considered.

Furthermore, to use a magnetic material which is an alloy or a laminated structure using Pt and Co and includes Y as a magnetic material which is in contact with the intermediate layer 13 is considered.

4. Modification Examples

Although embodiments of the present technology have been described above, the present technology is not limited to the specific example exemplified by the above-description.

For an example, a structure of the storage element according to the embodiments of the present technology is described as a configuration of magneto resistance effect element such as TMR element, such a magneto resistance effect element as a TMR element can be not only the storage device described above and but also various electronic apparatuses, electrical apparatus, and the like, such as a magnetic head, a hard disk drive equipped with such a magnetic head, an integrated circuit chip, various electronic devices such as a personal computer, a mobile terminal, a mobile phone, a magnetic sensor equipment, electrical equipment, and the like.

Figure 9A:
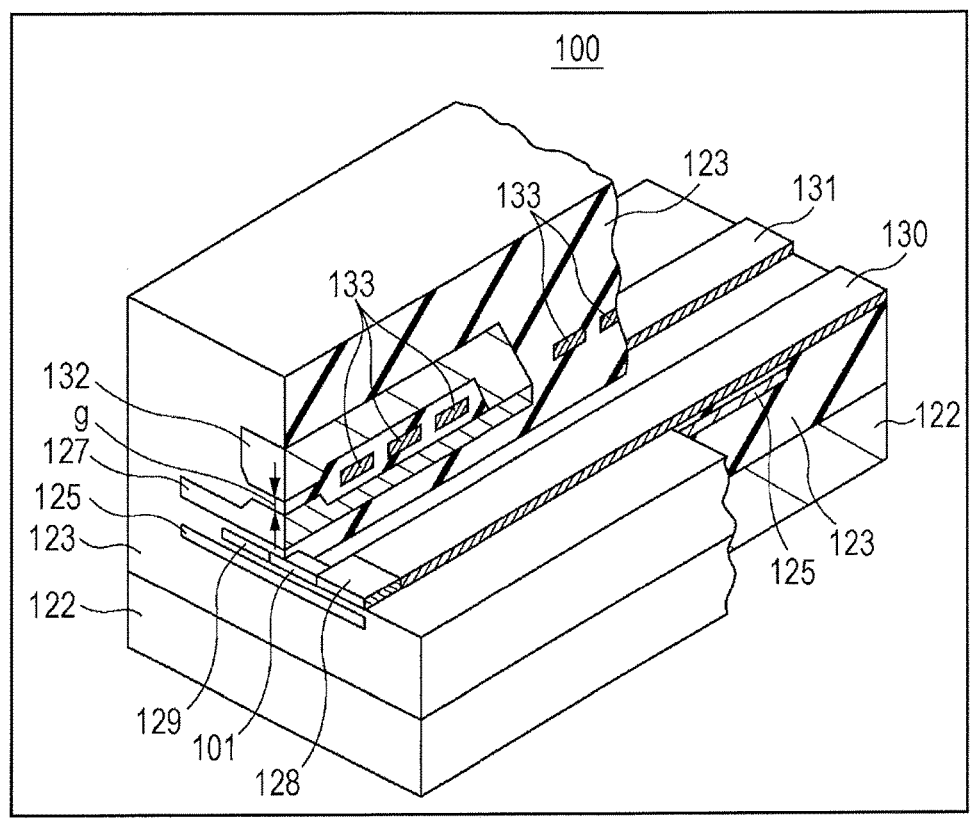
FIG. 9A is a diagram which describes an application example of a composite magnetic head according to an embodiment.
Figure 9B:
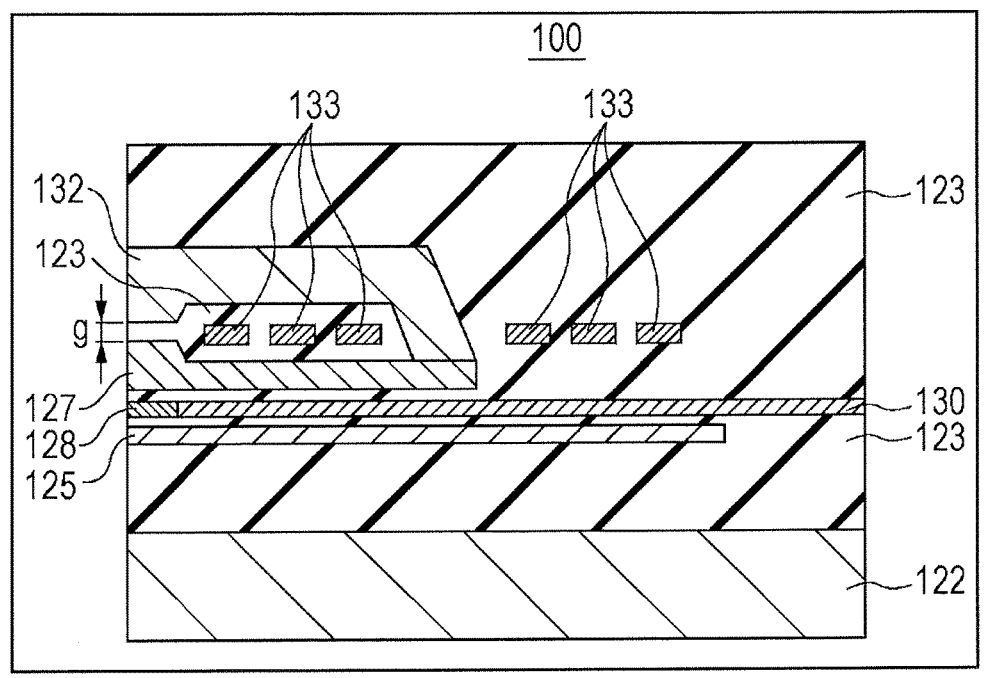
FIG. 9B is a diagram which describes an application example of a composite magnetic head according to an embodiment.

FIG. 9A and FIG. 9B show examples where a magneto resistance effect element 101 using the structure of the storage element 3 described above is applied to a composite magnetic head 100. Note that FIG. 9A is a perspective view of the composite magnetic head 100 that has been partially cut away to show the internal structure and FIG. 9B is a cross-sectional view of the composite magnetic head 100.

The composite magnetic head 100 is a magnetic head used in a hard disk device and the like and has a magneto resistance effect-type magnetic head according to an embodiment of the present disclosure formed on a substrate 122 and has an inductive magnetic head formed so as to be laminated on the magneto resistance effect-type magnetic head. Here, the magneto resistance effect-type magnetic head operates as a reproduction head and the inductive magnetic head operates as a recording head. That is, the composite magnetic head 100 is configured by combining the reproduction head and the recording head.

The magneto resistance effect-type magnetic head embedded in the composite magnetic head 100 is a so-called "shield-type MR head" and includes a first magnetic shield 125 formed on the substrate 122 through an insulating layer 123, the magneto resistance effect element 101 formed on the first magnetic shield 125 through the insulating layer 123, and a second magnetic shield 127 formed on the magneto resistance effect element 101 through the insulating layer 123. The insulating layer 123 is made from an insulation material such as $Al_2O_3$, $SiO_2$, or the like.

The first magnetic shield 125 magnetically shields a lower layer side of the magneto resistance effect element 101, and is made of a soft magnetic material such as Ni—Fe and the like. The magneto resistance effect element 101 is formed on the first magnetic shield 125 through the insulating layer 123.

The magneto resistance effect element 101 functions in the magneto resistance effect-type magnetic head as a magnetism sensing element that detects a magnetic signal from a magnetic recording medium. The magneto resistance effect element 101 has the same film configuration (layered structure) as the storage element 3 described above.

The magneto resistance effect element 101 is formed in a substantially rectangular shape with one side surface exposed to a facing surface of a magnetic recording medium. Then, bias layers 128 and 129 are disposed at both ends of the magneto resistance effect element 101. In addition, connection terminals 130 and 131 that are connected to the bias layers 128 and 129 are formed. A sense current is supplied to the magneto resistance effect element 101 through the connection terminals 130 and 131.

Furthermore, the second magnetic shield 127 is provided on the bias layers 128 and 129 through the insulating layer 123.

The inductive magnetic head formed so as to be laminated (formed by lamination) on the magneto resistance effect-type magnetic head as described above includes a magnetic core, which is made of the second magnetic shield 127 and an upper layer core 132, and a thin-film coil 133 formed so as to be wound around the magnetic core.

The upper layer core 132, together with the second magnetic shield 127, forms a closed magnetic path, becomes a magnetic core of an inductive magnetic head, and is made of a soft magnetic material such as Ni—Fe and the like 44. Here, front end portions of the second magnetic shield 127 and the upper layer core 132 are exposed to the facing surface of a magnetic recording medium, and at rear end portions thereof, the second magnetic shield 127 and the upper layer core 132 are formed to be in contact each other. Here, the front end portions of the second magnetic shield 127 and the upper layer core 132 are formed so that the second magnetic shield 127 and the upper layer core 132 are spaced from each other with a predetermined gap in between at the facing surface of the magnetic recording medium.

That is, in the composite magnetic head 100, the second magnetic shield 127 not only magnetically shields an upper layer side of a magneto resistance effect element 126 but also serves as the magnetic core of the inductive magnetic head, so that the magnetic core of the inductive magnetic head is configured to have the second magnetic shield 127 and the upper layer core 132. Then, the gap g becomes a recording magnetic gap of the inductive magnetic head.

Moreover, a thin-film coil 133 embedded in the insulating layer 123 is formed on the second magnetic shield 127. Here, the thin-film coil 133 is formed so as to be wound around the magnetic core made of the second magnetic shield 127 and the upper layer core 132. Although not illustrated, both end portions of the thin-film coil 133 are exposed to the outside and terminals formed at both ends of the thin-film coil 133 become external connection terminals of the inductive magnetic head. That is, when recording a magnetic signal on a magnetic recording medium, a recording current is supplied to the thin-film coil 133 from these external connection terminals.

As described above, a laminated structure as a storage element according to the embodiments of the present technology is capable of being used as a reproduction head for a magnetic recording medium, that is, as a magnetism sensing element that detects a magnetic signal from a magnetic recording medium.

By applying a laminated structure as a storage element according to the embodiment of the present technology to a magnetic head, it is possible to realize a highly reliable magnetic head with excellent stability.

Figure 10:
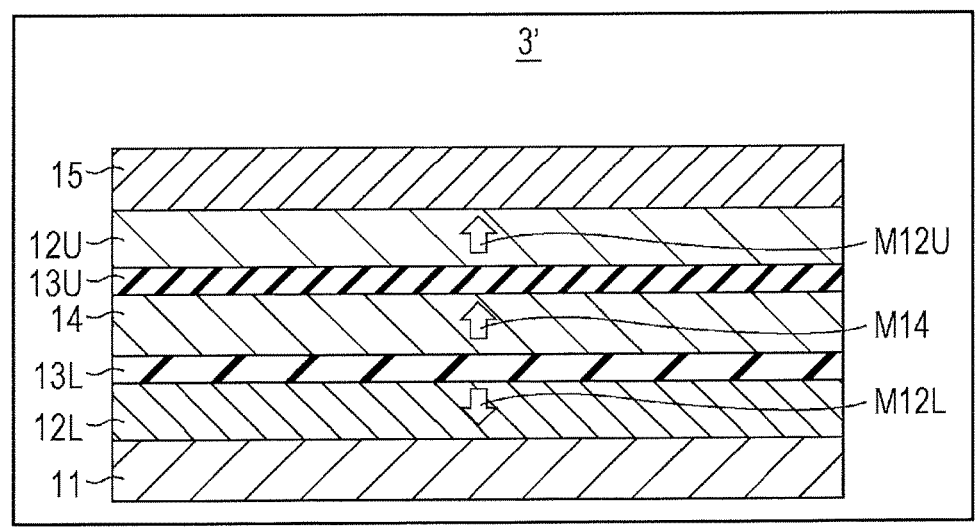
FIG. 10 is a diagram which describes a configuration of the storage element according to an embodiment as a modification example.

Although a structure of the storage element 3 made of the base layer 11/the magnetization fixed layer 12/the intermediate layer 13/the storage layer 14/and the cap layer 15 has been exemplified in a description hereto, as the storage element (and magnetic head) according to an embodiment of the present technology, it is also possible to adopt a structure as a storage element 3', in which the magnetization fixed layer 12 is divided and disposed on both a lower portion and a upper portion of the storage layer 14 like the base layer 11/the lower magnetization fixed layer 12L/the lower intermediate layer 13L/the storage layer 14/the upper intermediate layer 13U/the upper magnetization fixed layer 12U/the cap layer 15 as shown in FIG. 10.

The direction of magnetization M12 of the lower magnetization fixed layer 12L and the direction of magnetization M12U of the upper magnetization fixed layer 12U are both shown in FIG. 10. However, in this case, directions of magnetizations M12L and M12U are opposite to each other.

Moreover, in such case, a lower intermediate layer 13L and an upper intermediate layer 13U are made of an oxide film of MgO and the like in the same manner as the intermediate layer 13.

Even with a configuration in which the magnetization fixed layer 12 is disposed to be divided into the lower portion/the upper portion in this manner, the lower portion and the upper portion of the magnetization fixed layers 12 adopt the same structure as the magnetization fixed layer 12 described earlier, that is, a structure of a memory element in which a magnetic material that is not in contact with an intermediate layer (13U and 13L) among the magnetic materials of the magnetization fixed layer 12 is an alloy or a laminated structure using Pt and Co, and is a Y-added magnetic material and bonding intensity of the laminated ferri-pinned structure is increased compared to when using a Co—Pt single material, and thereby it is possible to obtain an effect of improving a memory operation stability in the same manner.

Also, although a case where the CoFeB compositions of the storage layer 14 and the magnetization fixed layer 12 are the same as each other has been exemplified in the above description, the compositions may have various other configurations within a range that does not depart from the gist of the present technology.

Although the ferromagnetic layers 12a and 12A-1 of the magnetization fixed layer 12 which are in contact with the intermediate layer 13 is a CoFeB single layer, it is possible to add elements and oxides in a range in which there is no significant drop in the coupling field.

Ta, Hf, Nb, Zr, Cr, Ti, V, and W can be exemplified as an element to be added and MgO, AlO, and $SiO_2$ can be exemplified as an oxide.

In addition, the magnetization fixed layer 12 is not limited to a laminated ferri magnetic structure.

The base layer 11 and the cap layer 15 may be a laminated structure of a single material or a plurality of materials.

The present technology can also be applied to a so-called "top-laminated ferri-type STT-MRAM" and, in such case, by using the Y-added Co—Pt, the effect of improving the memory operation stability can be obtained in the same manner.

Effects described in the present specification are merely exemplifications and not limited thereto, and other effects may be present without limitation.

Additionally, the present technology may also be configured as follows.

(1) A storage element includes:

a layered structure including a storage layer that has magnetization perpendicular to a film surface and in which an direction of magnetization is changed according to information, a magnetization fixed layer that has magnetization serving as a reference of information stored in the storage layer and perpendicular to a film surface, and an intermediate layer that is provided between the storage layer and the magnetization fixed layer and is made of a non-magnetic material, in which a direction of magnetization of the storage layer is changed and information is stored in the storage layer by injecting spin-polarized electrons in a lamination direction of the layered structure, the magnetization fixed layer has a laminated ferrimagnetic structure made of at least two ferromagnetic layers and a non-magnetic layer, and a magnetic material which is an alloy or a laminated structure using Pt and Co, and includes Y used as a magnetic material in the magnetization fixed layer.

(2) The storage element according to (1), in which a magnetic material that is assumed to be an alloy or a laminated structure using Pt and Co and includes Y is used as a magnetic material which is not in contact with the intermediate layer in the magnetization fixed layer.

(3) The storage element according to (2), in which an addition amount of the Y element is 12 at % or less.

(4) The storage element according to any one of (2) or (3), in which the addition amount of the Y element is 1 at % to 10 at %.

(5) The storage element according to any one of (2) to (4), in which a magnetic material which is in contact with the intermediate layer is configured to have a CoFeB magnetic layer in the magnetization fixed layer.

(6) A storage element includes:

a layered structure including a storage layer that has magnetization perpendicular to a film surface and in which a direction of the magnetization is changed according to information, a magnetization fixed layer that has magnetization serving as a reference of information stored in the storage layer and perpendicular to a film surface, and an intermediate layer that is provided between the storage layer and the magnetization fixed layer and is made of a non-magnetic material, in which a direction of magnetization of the storage layer is changed and information is stored in the storage layer by injecting spin-polarized electrons in a lamination direction of the layered structure, and a magnetic material which is an alloy or a laminated structure using Pt and Co, and includes Y is used as a magnetic material in the magnetization fixed layer.

(7) The storage element according to (6), in which an addition amount of the Y element is 12 at % or less.

(8) The storage element according to (6) or (7), in which the addition amount of the Y element is 1 at % to 10 at %.

(9) A storage device includes:

a storage element which holds information by a magnetization state of a magnetic material, and two types of wiring intersecting with each other, in which the storage element includes a layered structure including a storage element that includes a layered structure including a storage layer that has magnetization perpendicular to a film surface and in which an direction of the magnetization is changed according to information, a magnetization fixed layer that has magnetization serving as a reference of information stored in the storage layer and perpendicular to a film surface, and an intermediate layer that is provided between the storage layer and the magnetization fixed layer and is made of a non-magnetic material, in which a direction of magnetization of the storage layer is changed and information is stored in the storage layer by injecting spin-polarized electrons in a lamination direction of the layered structure, the magnetization fixed layer has a laminated ferri magnetic structure made of at least two ferromagnetic layers and a non-magnetic layer, a magnetic material which is an alloy or a laminated structure using Pt and Co, and includes Y is used as a magnetic material in the magnetization fixed layer, the storage element is disposed between the two types of wiring, and a current in the lamination direction flows to the storage element through the two types of wiring, and spin-polarized electrons are injected.

(10) A magnetic head includes:

a layered structure including a storage layer that has magnetization perpendicular to a film surface and in which a direction of magnetization is changed according to information, a magnetization fixed layer that has magnetization serving as a reference of information stored in the storage layer and perpendicular to a film surface, and an intermediate layer that is provided between the storage layer and the magnetization fixed layer and is made of a non-magnetic material, in which an direction of magnetization of the storage layer is changed by injecting spin-polarized electrons in a lamination direction of the layered structure, the magnetization fixed layer has a laminated ferri magnetic structure made of at least two ferromagnetic layers and a non-magnetic layer, and a magnetic material which is an alloy or a laminated structure using Pt and Co, and includes Y is used as a magnetic material in the magnetization fixed layer.

(11) A storage element having a layered structure and being configured for storing information, the storage element comprising:

a storage portion that includes a storage magnetization that is perpendicular to a film surface of the layered structure, wherein a direction of the storage magnetization is configured to change according to the information, a fixed magnetization portion that includes a reference magnetization serving as a reference to the storage magnetization, and an intermediate portion that is provided between the storage portion and the fixed magnetization portion and that is made of a non-magnetic material, wherein the fixed magnetization portion includes a laminated ferrimagnetic structure that comprises a first ferromagnetic layer, a second ferromagnetic layer, and a non-magnetic layer, and the fixed magnetization portion includes a first magnetic material that is an alloy or a laminated structure including Pt, Co, and Y.

(12) The storage element according to (11), wherein the first ferromagnetic layer includes the first magnetic material and is not in contact with the intermediate portion.

(13) The storage element according to (12), wherein an amount of the Y element in the first magnetic material is 12 at % or less.

(14) The storage element according to (12), wherein the amount of the Y element in the first magnetic material is 1 at % to 10 at %.

(15) The storage element according to (12), wherein the second ferromagnetic layer includes a second magnetic material that comprises CoFeB, the second ferromagnetic layer being in contact with the intermediate portion.

(16) The storage element according to (11), wherein the direction of magnetization of the storage magnetization is configured to change for storage of the information on the storage portion, by injection of spin-polarized electrons in a lamination direction of the layered structure.

(17) The storage element according to (11), wherein the storage portion, the intermediate portion and the fixed magnetization portion respectively comprise one or more layers arranged in a lamination direction of the layered structure.

(18) The storage element according to (17), wherein the first ferromagnetic layer, the non-magnetic layer and the second ferromagnetic layer of the fixed magnetization portion are arranged in the lamination direction, and wherein the first ferromagnetic layer includes Y—CoPt, the non-magnetic layer includes Ru and the second ferromagnetic layer includes CoFeB.

(19) The storage element according to (11),
further comprising a cap portion on the storage portion, wherein the cap portion comprises a first cap portion layer and a second cap portion layer arranged in a lamination direction of the layered structure, and wherein the first cap portion layer includes Ru and the second cap portion layer includes Ta.

(20) The storage element according to (11),
wherein the second ferromagnetic layer includes CoFeB.

(21) The storage element according to (17),
wherein the fixed magnetization portion comprises a third ferromagnetic layer, the non-magnetic layer, the first ferromagnetic layer, and the second ferromagnetic layer are arranged in the lamination direction, and wherein the third ferromagnetic layer includes CoPt or Y—CoPt, the non-magnetic layer includes Ru, the first ferromagnetic layer includes Y—CoPt, and the second ferromagnetic layer includes CoFeB.

(22) The storage element according to (11), further comprising:
a second non-magnetic layer located between the first ferromagnetic layer and the second ferromagnetic layer.

(23) A storage element having a layered structure and being configured for storing information, the storage element comprising:
a storage portion that includes a storage magnetization that is perpendicular to a film surface of the layered structure,
wherein a direction of the storage magnetization is configured to change according to the information,
a fixed magnetization portion that includes a reference magnetization serving as a reference to the storage magnetization, and
an intermediate portion that is provided between the storage portion and the fixed magnetization portion and that is made of a non-magnetic material,
wherein the fixed magnetization portion includes a first magnetic material that is an alloy or a laminated structure including Pt, Co, and Y.

(24) The storage element according to (23),
wherein an amount of the Y element in the first magnetic material is 12 at % or less.

(25) The storage element according to (23),
wherein the amount of the Y element in the first magnetic material is 1 at % to 10 at %.

(26) The storage element according to (23),
wherein the storage portion, the intermediate portion and the fixed magnetization portion respectively comprise one or more layers arranged in a lamination direction of the layered structure.

(27) The storage element according to (26),
wherein a first ferromagnetic layer, a non-magnetic layer and a second ferromagnetic layer of the fixed magnetization portion are arranged in the lamination direction, and wherein the first ferromagnetic layer includes Y—CoPt, the non-magnetic layer includes Ru and the second ferromagnetic layer includes CoFeB.

(28) The storage element according to (23),
wherein the second ferromagnetic layer includes CoFeB.

(29) A storage device comprising:
a storage element according to (11); and
two types of wiring which intersect with each other, wherein
a current in a lamination direction of the layered structure flows to the storage element through the two types of wiring, and spin-polarized electrons are injected.

(30) A storage device comprising:
a storage element according to (23); and
two types of wiring which intersect with each other, wherein
a current in a lamination direction of the layered structure flows to the storage element through the two types of wiring, and spin-polarized electrons are injected.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Gate electrode
2 Element separating layer
3, 3' storage element
4 contract layer
6 bit line
7 source region
8 drain region
9 wiring
10 semiconductor substrate
11 base layer
12 magnetization fixed layer
12L lower magnetization fixed layer
12U upper magnetization fixed layer
13 intermediate layer
13L lower intermediate layer
13U upper intermediate layer
14 storage layer
15 cap layer

The invention claimed is:
1. A storage element having a layered structure and being configured for storing information, the storage element comprising:
a storage portion that includes a storage magnetization that is perpendicular to a film surface of the layered structure, wherein a direction of the storage magnetization is configured to change according to the information,
a fixed magnetization portion that includes a reference magnetization serving as a reference to the storage magnetization, and
an intermediate portion that is provided between the storage portion and the fixed magnetization portion and that is made of a non-magnetic material,
wherein the fixed magnetization portion includes a laminated ferrimagnetic structure that comprises a first ferromagnetic layer, a second ferromagnetic layer, and a non-magnetic layer disposed between the first ferromagnetic layer and the second ferromagnetic layer,
the fixed magnetization portion includes a first magnetic material that is an alloy or a laminated structure including Pt, Co, and Y, the first magnetic material being in contact with the non-magnetic layer, and
the amount of the Y element in the first magnetic material is 1 at % to 12 at %.

2. The storage element according to claim 1,
wherein the first ferromagnetic layer includes the first magnetic material and is not in contact with the intermediate portion.

3. The storage element according to claim 2,
wherein the amount of the Y element in the first magnetic material is 1 at % to 10 at %.

4. The storage element according to claim 2,
wherein the second ferromagnetic layer includes a second magnetic material that comprises CoFeB, the second ferromagnetic layer being in contact with the intermediate portion.

5. The storage element according to claim 1,
wherein the direction of magnetization of the storage magnetization is configured to change for storage of the information on the storage portion, by injection of spin-polarized electrons in a lamination direction of the layered structure.

6. The storage element according to claim 1,
wherein the storage portion, the intermediate portion and the fixed magnetization portion respectively comprise one or more layers arranged in a lamination direction of the layered structure.

7. The storage element according to claim 6,
wherein the first ferromagnetic layer, the non-magnetic layer and the second ferromagnetic layer of the fixed magnetization portion are arranged in the lamination direction, and wherein the first ferromagnetic layer includes Y—CoPt, the non-magnetic layer includes Ru and the second ferromagnetic layer includes CoFeB.

8. The storage element according to claim 6,
wherein the fixed magnetization portion comprises a third ferromagnetic layer, the non-magnetic layer, the first ferromagnetic layer, and the second ferromagnetic layer are arranged in the lamination direction, and wherein the third ferromagnetic layer includes CoPt or Y—CoPt, the non-magnetic layer includes Ru, the first ferromagnetic layer includes Y—CoPt, and the second ferromagnetic layer includes CoFeB.

9. The storage element according to claim 8, further comprising:
a second non-magnetic layer located between the first ferromagnetic layer and the second ferromagnetic layer.

10. The storage element according to claim 1,
further comprising a cap portion on the storage portion,
wherein the cap portion comprises a first cap portion layer and a second cap portion layer arranged in a lamination direction of the layered structure, and wherein the first cap portion layer includes Ru and the second cap portion layer includes Ta.

11. The storage element according to claim 1,
wherein the second ferromagnetic layer includes CoFeB.

12. A storage device comprising:
a storage element according to claim 1; and
two types of wiring which intersect with each other, wherein
a current in a lamination direction of the layered structure flows to the storage element through the two types of wiring, and spin-polarized electrons are injected.

13. The storage element according to claim 1,
wherein a thickness of the fixed magnetization portion is 0.5 nm to 30 nm.

14. A storage element having a layered structure and being configured for storing information, the storage element comprising:
a storage portion that includes a storage magnetization that is perpendicular to a film surface of the layered structure,
wherein a direction of the storage magnetization is configured to change according to the information,
a fixed magnetization portion that includes a reference magnetization serving as a reference to the storage magnetization,
an intermediate portion that is provided between the storage portion and the fixed magnetization portion and that is made of a non-magnetic material disposed between the first ferromagnetic layer and the second ferromagnetic layer,
the fixed magnetization portion includes a first magnetic material that is an alloy or a laminated structure including Pt, Co, and Y, the first magnetic material being in contact with the non-magnetic layer, and
the amount of the Y element in the first magnetic material is 1 at % to 12 at %.

15. The storage element according to claim 14,
wherein the amount of the Y element in the first magnetic material is 1 at % to 10 at %.

16. The storage element according to claim 14,
wherein the storage portion, the intermediate portion and the fixed magnetization portion respectively comprise one or more layers arranged in a lamination direction of the layered structure.

17. The storage element according to claim 16,
wherein a first ferromagnetic layer, a non-magnetic layer and a second ferromagnetic layer of the fixed magnetization portion are arranged in the lamination direction, and wherein the first ferromagnetic layer includes Y—CoPt, the non-magnetic layer includes Ru and the second ferromagnetic layer includes CoFeB.

18. The storage element according to claim 14,
wherein the second ferromagnetic layer includes CoFeB.

19. A storage device comprising:
a storage element according to claim 14; and
two types of wiring which intersect with each other, wherein
a current in a lamination direction of the layered structure flows to the storage element through the two types of wiring, and spin-polarized electrons are injected.

20. The storage element according to claim 14,
wherein a thickness of the fixed magnetization portion is 0.5 nm to 30 nm.

\* \* \* \* \*